United States Patent Office 3,832,188
Patented Aug. 27, 1974

3,832,188

PHOTOSENSITIVE POLYAMIDE COMPOSITIONS

Yasuo Bamba, Kyoto, and Masao Iwamoto, Otsu, Japan, assignors to Toray Industries, Inc., Tokyo, Japan

No Drawing. Filed Aug. 14, 1972, Ser. No. 280,484
Claims priority, application Japan, Feb. 29, 1972, 47/20,133
**Int. Cl. C03c *1/70***
U.S. Cl. 96—115 P 8 Claims

ABSTRACT OF THE DISCLOSURE

A photosensitive polyamide composition consisting essentially of (I) about 40–90% by weight of an alcohol soluble linear polyamide,
(II) about 10–60% by weight of a photopolymerizable unsaturated compound having at least one group selected from the group consisting of $$—N(CH_2CH(OH)CH_2OCOCR''{=}CH_2)_2$$

and $$—NR'CH_2CH(OH)CH_2OCOCR''{=}CH_2$$

wherein R′ and R″ are members selected from the group consisting of hydrogen and a hydrocarbon group having 1 to 12 carbon atoms,
(III) about 0.01–10% by weight of a phosphorous compound having the formula

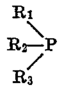

wherein $R_1$ is phenyl or its derivatives and $R_2$ and $R_3$ are members selected from the group consisting of alkyl, aryl and aralkyl having 1 to 15 carbon atoms.

This invention relates to a photosensitive polyamide composition of the type referred to in the abstract.

Heretofore, photosensitive polyamide compositions comprised of polyamides, photopolymerizable unsaturated compounds and photoinitiators have been used for printing plates (letter press and offset press), photoresists, photocurable paints, image formation materials, etc.

When such compositions are formed into sheets or films, they are often heated to a high temperature. Also, the sheets and films thus produced are also often stored for a long time in various conditions including heat. Therefore, said compositions have needed inhibitors against polymerization by heat.

The following inhibitor compounds have been recommended for addition to photosensitive polyamide compositions in prior patents:

(1) Methylene Blue and its derivatives
(2) p-Methoxyphenol, Hydroquinone, β-Naphthol, Cuprous chloride, Nitrobenzene, Tertiary amines These reagents are known as inhibitors for radical polymerization. However, the photosensitivity of the compositions is decreased by these compounds.

In the known inhibitors, when moulding a photosensitive composition at a high temperature or for a long period of time, the activities of some inhibitors decrease. In other cases, they reduce the photosensitivity of the compositions, or color the composition, or both.

When large quantities of inhibitor are used in order to obtain the desired effect, the photosensitivity of the product is markedly reduced.

This invention is based on the fact that a composition consisting of an alcohol soluble linear polyamide, a photopolymerizable substance and an organic phosphorous compound is stable with respect to heat and highly sensitive to light.

Specifically, this invention relates to a photosensitive polyamide composition consisting of (I) about 40–90% by weight of an alcohol soluble linear polyamide,
(II) about 10–60% by weight of a photopolymerizable unsaturated compound having at least one group selected from the group consisting of $$—N(CH_2CH(OH)CH_2OCOCR''{=}CH_2)_2$$

and $$—NR'CH_2CH(OH)CH_2OCOCR''{=}CH_2$$

wherein R′ and R″ are members selected from the group consisting of hydrogen and a hydrocarbon group having 1 to 12 carbon atoms, and
(III) about 0.01–10% by weight of a phosphorous compound having the general formula

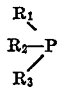

wherein $R_1$ is phenyl or its derivative and $R_2$ and $R_3$ are members selected from the group consisting of alkyl, aryl and aralkyl having 1 to 15 carbon atoms.

The alcohol soluble linear polyamide (I) may be prepared by a copolymerization reaction of some dibasic acids having 2 to 12 carbon atoms with some diamines having 1 to 16 carbon atoms.

Preferred dibasic acids are:
Adipic acid, sebacic acid, azelaic acid, diglycol acid.
Preferred diamines are:
Trimethylene diamine, hexamethylenediamine, trimethylhexamethylene diamine, 4,4′-diaminocyclohexylmethane.

ω-aminoacid, lactam or these derivatives having 1 to 12 carbon atoms may also be used as a monomer for copolymerization in this invention.

Furthermore, copolyamides obtained from a copolymerization reaction of about 20–50% by weight ε-caprolactam, about 25–40% by weight hexamethylenediammonium adipate, and about 10–60% by weight of a third component selected from the group consisting of hexamethylenediammonium sebacate (610), hexamethylenediammonium azelate (612), p-aminocyclohexylmethane adipate (PACM6), trimethylhexamethylenediammonium adipate (TMD6) and Isophoronediammonium adipate (IPD6) are most preferable for this invention.

Especially, as the third component, TMD6 is the most suitable for this invention for the following reasons.

(1) It is easily rendered insoluble by polymerization of photopolymerizable unsaturated compounds coexisting in the compositions.
(2) It has good solubility for solvents (especially lower alcohols).
(3) It has excellent light penetration.
(4) It has a low melting temperature.

In the application for photosensitive printing plate materials, these properties affect respectively, photosensitivity, reproductivity (resolution) and easy processing.

In this invention, the amount of the alcohol-soluble polyamide (I) is 40–90% by weight, preferably 50–70% by weight.

Photopolymerisable unsaturated compounds (II) are easily obtained by the addition reaction of compounds having active hydrogen, preferably primary or secondary amines, and glycidyl methacrylate.

This addition reaction is carried out either without a solvent or in a proper solvent.

In the case of an aliphatic primary amine and glycidyl (meth)acrylate, the mixture of both components should be allowed to remain overnight and then the reaction proceeds quantitatively.

Compounds having at least one $$—N(CH_2CH(OH)CH_2OCOCR{=}CH_2)_2$$

group are obtained from the reaction of glycidyl acrylate or glycidyl methacrylate ($R{=}CH_3$) with compounds having a primary amino group, for example, n-butylamine, n-propylamine, benzylamine, hexamethylenediamine, trimethylhexamethylenediamine, isophoronediamine, xylylenediamine. Those compounds having at least one $$—NR'CH_2CH(OH)CH_2OCOCR{=}CH_2$$

group are also obtained from the reaction of glycidyl acrylate or methacrylate with secondary amines such as methylethylamine, diethylamine and piperidine.

Compounds having at least one $$—N(CH_2CH(OH)CH_2OCOCR{=}CH_2)_2$$

group and one $—NR'CH_2CH(OH)CH_2OCOCR{=}CH_2$ group are produced by the reaction of glycidyl (meth-) acrylate with amines consisting of primary and secondary amino groups such as diethylenetriamine, heptaethyleneoctamine and 1-(2'-aminoethyl) piperidine.

In this invention the amount of the photopolymerizable unsaturated compound (II) is about 10–60% by weight, preferably 20–50% by weight. In this invention phosphorous compounds, which are added in order to stabilize the photosensitive composition to heating and enhance the sensitivity to light, are shown by the following formula:

wherein $R_1$ is phenyl or its derivative and $R_2$ and $R_3$ are members selected from the group consisting of alkyl, aryl and aralkyl group having 1 to 15 carbon atoms, preferably 2–12 carbon atoms.

The examples of the phosphorous compounds are as follows: triphenylphosphine, dibutylphenylphosphine, methyldiphenylphosphine, ethyldiphenylphosphine, and metylbutylphenylphosphine.

The amount of this phosphorous compound must be enough to stabilize the photosensitive compounds for heating and to provide the desired photosensitivity. It is generally 0.01 to 10% by weight, preferably 0.05 to 3% by weight to the compositions. The photosensitive polymer composition added to the phosphorous compound is much more stable to heating and more sensitive to light than other known photosensitive polymer compositions, as shown in examples. This meritorious characteristic makes it possible to mould the composition at a higher temperature and to lengthen the life of the composition.

The photosensitive composition of this invention may involve a photosensitizer, an inhibitor to thermal polymerization, a plasticizer besides the photopolymerizable monomers described above. The photopolymerizable composition of this invention is stable to heating and sensitive to light (UV). In some cases with the addition of a photosensitizer and an inhibitor to thermal polymerization, the stabilization and sensitivity described above is much enhanced. Such stablizers and sensitizers are shown as follows:

(a) Sensitizer—benzophenone and its derivatives, benzoin and its derivatives, anthranquinone and its derivatives, uranium compounds, sulphur compounds, halogen compounds and xanthone.

(b) Inhibitor—hydroquinone and its derivatives, nitro compounds, and phenol and its derivatives.

The amount of the sensitizer is about 0.001–10% by weight and that of the inhibitor is 0.001–1% by weight to the compositions. There is difficulty mixing two or more sensitizers and inhibitors.

In this invention the addition of haloxyalkyl (meth) acrylates: preferably 5-chloro-2-oxypropyl meth-acrylate, 3-chloro-2-oxypropyl acrylate and 3-chloro-2-oxy methacrylate, provide favorable properties as the photosensitive layer of the photopolymer printing plate. The amount of haloxyalkyl (meth) acrylate is preferably 10–1000 parts by weight to 100 parts by weight of photosensitive unsaturated compounds (II).

This photosensitive composition is moulded to printing plates by the usual methods such as pressing, extrusion, calendering and coating. Usually the photosensitive layer is joined with a preferable base such as steel, aluminum and plastic films, to improve the mechanical strength and to avoid the expansion and contraction of the layer.

These photosensitive compositions or layers can polymerize and become insoluble in usual solvents by exposure to ultraviolet light which is easily applied by the usual exposure instruments such as high pressure or super high pressure mercury lamps, carbon-arc lamps, fluorescent lamps and xenon lamps. The exposure time is usually in the range of about 10 seconds to 10 minutes.

The exposed area of the photosensitive layer becomes insoluble in the usual solvents such as alcohols, glycols, phenols, halogenated hydrocarbons, and mixtures of such solvents. On the other hand, the non-exposed area is soluble in such solvents, and so by washing out with the solvent, a printing plate which has reliefs corresponding to the negative is created. The printing plate is dried to remove the solvent and can be used to print immediately.

A photosensitive layer using the photosensitive composition of this invention gives excellent printing plates with respect to processing properties, such as photosensitivity, faithfulness of reliefs in negatives, storage time and mechanical strength, than has been given by known photosensitive layers in the past.

Example 1

60% by weight of "Ultramide 1 C" a trade name of BASF Company, (6/66/PACM6), which is soluble in alcohol, was dissolved in methanol, and 20% by weight of the reaction product of glycidyl methacrylate (4 mols) and m-xylylenediamine (1 mol), 10% by weight of 3-chloro-2-oxy propyl methacrylate, 7% by weight of acrylamide, 1% by weight of triphenylphosphine and 2% by weight of benzophenone were added to the solution and stirred. The composition was thoroughly dried.

The composition was pressed on an aluminum foil to make a plate. The thickness of the photosensitive layer was 0.5 mm. The layer was soluble in methanol.

A 21-step senstivity guide (Gray Scale) (Stouffer Graphic Arts Equipment Co.) was placed closely adjacent to the photosensitive layer and exposed by a 500 w. super-high pressure mercury lamp from a distance of 40 cm. for 1 minute. The unexposed area of the plate was washed out with methanol/trichloroethylene (80/20) and the Gray Scale was insolubilized until it showed 19 degrees.

EXAMPLE 2

Instead of "Ultramide 1C" a copolyamide consisting by weight of 35% of 2, 4, 4-trimethylhexamethylenediammonium adipate, 30% of ϵ-caprolactam and 35% of hexamethylenediammonium adipate was used and a printing plate was prepared by the same method as in example 1. The unexposed area was washed out with ethanol to give a letterpress printing plate which had good relief.

EXAMPLE 3

Runs were made like example 1 but a component was changed. The other conditions were just the same as in example 1. The results of Stouffer's 21 Step Sensitivity Guide and heat stability are shown in Table 1.

TABLE 1

| Example | Phosphine (wt. percent) | Photosensitizer (wt. percent) | Stabilizer (wt. percent) | Stouffer's guide No.[1] | Thermal stability [2]* |
|---|---|---|---|---|---|
| 3 | $Ph_3P$(0.1) | | | 9 | 0 |
| 4 | | Benzophenone (3.0) | Hydroquinone(0.1) | | X |
| 5 | | Benzophenone (3.0) | Hydroquinone (1.0) | 6 | 0 |
| 6 | $Ph_2P$-n-$C_4H_9$ (0.1) | | | 7 | 0 |
| 7 | $Ph_3P$ (0.1) | Benzophenone (3.0) | Hydroquinone (0.1) | 17 | 0 |
| 8 | (P-$CH_3C_6H_4)_3P$ (0.5) | Anthraquinone (1.0) | Hydroquinone (0.1) | 17 | 0 |
| 9 | $Ph_2PCH_3$ (0.5) | Benzophenone (3.0) | Phenothiazine (0.02) | 16 | 0 |

[1] 500 W.-super-high pressure mercury lamp at a distance of 40 cm. for 1 minute.
[2] Treated at 150° C. for 15 minutes.
*0 means thermally polymerized; X means thermally not polymerized.

EXAMPLES 10–14

In the same manner as in example 1 some reaction products of glycidyl acrylate derivatives with amines were used instead of the reaction product of glycidyl methacrylate with xylylendiamine. The other conditions were similar to example 1. The results of Stouffer's 21 step guide test are shown in Table 2 which follows. By exposing through a negative, the photosensitive layers gave an excellent letterpress printing plate.

TABLE 2

| Example | Reaction product of glycidyl acrylate derivatives with amine | Stouffer's 21 step guide |
|---|---|---|
| 10 | $X_2N-CH_2CH_2NXCH_2CH_2NX_2$ | 16 |
| 11 | $C_4H_9NY_2$ | 14 |
| 12 | 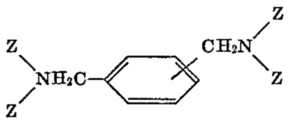 | 18 |
| 13 | 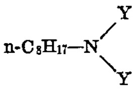 | 13 |
| 14 | 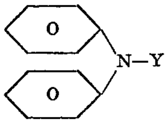 | 11 |

NOTE: $X=CH_2CH(OH)CH_2OCOCH=CH_2$;
$Y=-CH_2CH(OH)CH_2OCOC(CH_3)=CH_2$;
$Z=-CH_2CH(OH)CH_2OCOC(n\text{-}C_4H_9)=CH_2$.

The following is claimed:

1. A photosensitive polyamide composition consisting essentially of (I) about 40–90% by weight of an alcohol soluble linear polyamide, (II) about 10–60% by weight of a photopolymerizable unsaturated compound having at least one group selected from the group consisting of $-N(CH_2CH(OH)CH_2OCOCR''=CH_2)_2$ and
$-NR'CH_2CH(OH)CH_2OCOCR''=CH_2$ wherein R and R'' are members selected from the group consisting of hydrogen and a hydrocarbon group having 1 to 12 carbon atoms, and wherein said photopolymerizable unsaturated compound is a reaction product of an acrylate selected from the group consisting of glycidylacrylate and glycidylmethacrylate with an amine selected from the group consisting of a primary amine having 1 to 10 carbon atoms and a secondary amine having at least 2 carbon atoms.

(III) about 0.01–10% by weight of a phosphorous compound having the formula

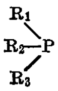

wherein $R_1$ is a member selected from the group consisting of phenyl and p-tolyl and $R_2$ and $R_3$ are members selected from the group consisting of alkyl, aryl and aralkyl having 1 to 15 carbon atoms.

2. A photosensitive polyamide composition of Claim 1 wherein said alcohol soluble polyamide (I) is a copolyamide obtained from a copolymerization reaction of about 20–50% by weight of ε-caprolactam, about 25–40% by weight of hexamethylenediammonium adipate and about 10–60% by weight of a compound selected from the group consisting of hexamethylenediammonium sebacate (610), hexamethylenediammonium (612), p-aminocyclohexylmethane adipate (PACM6), trimethylhexamethylenediammonium adipate (TMD6), and Isophoronediammonium adipate (IPD6).

3. A photosensitive polyamide composition of Claim 1 wherein said photopolymerizable unsaturated compound is a reaction product of an acrylate with an amine selected from the group consisting of n-butylamine, n-propylamine, benzylamine, hexamethylenediamine, trimethylhexamethylenediamine, isophoronediamine, xylylenediamine, methylethylamine, diethylamine, piperidine, diethylenetriamine, heptaethyleneoctamine and 1-(2'-aminoethyl) piperidine.

4. A photosensitive polyamide composition of Claim 1 wherein, in said phosphorous compound, $R_2$ and $R_3$ are members selected from the group consisting of alkyl having 1 to 15 carbon atoms and phenyl.

5. A photosensitive polyamide composition of Claim 1 wherein said alcohol soluble polyamide (I) is a copolyamide obtained from a copolymerization reaction of about 20–50% by weight of ε-caprolactum, about 25–40% by weight hexamethylenediammonium adipate and about 10–60% by weight trimethylhexamethylenediammonium-adipate.

6. A photosensitive polyamide composition of Claim 1 wherein said photopolymerizable unsaturated compound (II) is a reaction product of glycidyl methacrylate and xylylenediamine.

7. A photosensitive polyamide composition of Claim 1 wherein said phosphorous compound is triphenylphosphine.

8. A photosensitive polyamide composition of Claim 4 wherein $R_1$ is phenyl.

References Cited

UNITED STATES PATENTS

| | | | |
|---|---|---|---|
| 3,682,808 | 8/1972 | Krauch et al. | 204—159.15 |
| 3,699,022 | 10/1972 | Behrens et al. | 204—159.15 |
| 3,619,393 | 11/1971 | Stahly | 204—159.15 |

RONALD H. SMITH, Primary Examiner

U.S. Cl. X.R.

96—33, 35.1, 115R; 204—159.15, 159.19